United States Patent
Chen et al.

(10) Patent No.: US 7,651,960 B2
(45) Date of Patent: Jan. 26, 2010

(54) CHEMICAL VAPOR DEPOSITION METHOD PREVENTING PARTICLES FORMING IN CHAMBER

(75) Inventors: Neng-Kuo Chen, Hsin-Chu (TW); Teng-Chun Tsai, Hsin-Chu (TW); Hsiu-Lien Liao, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 672 days.

(21) Appl. No.: 10/907,857

(22) Filed: Apr. 18, 2005

(65) Prior Publication Data

US 2006/0234518 A1 Oct. 19, 2006

(51) Int. Cl.
*C23C 16/40* (2006.01)
*B05D 3/00* (2006.01)
*H01L 21/469* (2006.01)

(52) U.S. Cl. .............. 438/787; 438/710; 427/508; 427/553; 427/255.28

(58) Field of Classification Search ............... 438/710, 438/787, 905; 427/255.28, 508, 553, 595
See application file for complete search history.

(56) References Cited

U.S. PATENT DOCUMENTS 6,589,854 B2 * 7/2003 Liu et al. ............... 438/435
7,288,284 B2 * 10/2007 Li et al. .................. 427/237
7,320,944 B1 * 1/2008 Fastow et al. ............ 438/787
2006/0219169 A1 * 10/2006 Chen et al. ............... 118/715

FOREIGN PATENT DOCUMENTS

CN 1396643 A 2/2003
CN 1590582 A 3/2005

* cited by examiner

Primary Examiner—Zandra Smith
Assistant Examiner—Pamela E Perkins
(74) Attorney, Agent, or Firm—Winston Hsu

(57) ABSTRACT

Preventing a chemical vapor deposition (CVD) chamber from particle contamination in which a higher low-frequency radio frequency (LFRF) power and longer process time are provided to vacate the chamber and perform a pre-heat process. Following that, a pre-oxide layer is formed on the chamber wall, while a high-frequency radio frequency bias is provided to the chamber. The high-power LFRF is continuously provided to the chamber to sustain the temperature of the chamber, and then a main oxide layer deposition process is performed. The method is able to form an oxide layer of better quality on a CVD chamber wall, so as to solve the particle problem in the prior art. Therefore, yield is improved and the maintenance cost is reduced.

14 Claims, 2 Drawing Sheets

CHEMICAL VAPOR DEPOSITION METHOD PREVENTING PARTICLES FORMING IN CHAMBER

BACKGROUND OF INVENTION

1. Field of the Invention

The present invention is related to a chemical vapor deposition method that prevents particles from forming in a chamber, particularly related to a high-density plasma chemical vapor deposition method that prevents particles from forming in a chamber.

2. Description of the Prior Art

In semiconductor processes, in order to provide good electrical isolation, and to prevent short-circuiting between electric elements on a wafer, a localized oxidation isolation (LOCOS) process, or a shallow trench isolation (STI) process is used to isolate and protect the elements. Because the field oxide layer of the LOCOS process occupies a good deal of area on the wafer, and bird's beak can occur when growing the field oxide, an STI process is typically used in the semiconductor processes since the line width is below 0.25 µm.

Please refer to FIG. 1. In a typical STI process, a semiconductor substrate 4 is covered by an oxide layer 12, which serves as a buffer layer, so as to prevent the substrate from being damaged by thermal stress in subsequent processes. Following that, a silicon nitride layer 2 is formed on the oxide layer 12. A patterned photoresist (not shown) is put on the silicon nitride layer 2 and expose other parts of the silicon nitride layer 2 so as to define positions of STI. The exposed parts of the silicon nitride layer 2 are removed by an etching step to complete a pattern transform process so as to form a patterned silicon nitride layer 2. The patterned silicon nitride layer 2 is then applied as a mask, and parts of the semiconductor substrate 4, which are uncovered by the silicon nitride layer 2, are etched out to form trenches 8. Following that, silicon oxide 6 is deposited to fill the trenches 8. Lastly, a chemical mechanical polishing process is performed to complete the STI process.

However, due to decreasing of the line width, it becomes difficult to use conventional chemical vapor deposition (CVD) in an STI process. When using conventional CVD in an STI process, the deposition may fill the openings of the trenches 8 to form overhang, and thus causes problems, such as uneven coverage of voids or seams, or preventing the trenches from being filled. Therefore, a high-density plasma chemical vapor deposition (HDP-CVD) is used in the STI process presently. A chemical vapor deposition step and a sputtering etching step are performed in an HDP-CVD process. The sputtering etching step is able to remove deposition clogged in the openings of the trenches 8, and thus enable the trenches 8 be filled with the silicon oxide 6, which is deposited by chemical vapor deposition.

However, an oxide thin film is formed on the wall of the chamber while using an HDP-CVD process to deposit oxide. The oxide thin film may strip off the wall in subsequent processes and thus become a particle source that causes contamination. Therefore, a pre-oxide layer with appropriate thickness and quality is formed on the chamber wall in advance to enable the oxide thin film formed later to adhere to the pre-oxide layer, so as to prevent this particle issue. In order to form the pre-oxide layer, silane ($SiH_4$) and oxygen ($O_2$) are introduced to the chamber to form on the chamber wall a pre-oxide layer with appropriate thickness and quality.

After the pre-oxide layer is formed, a main HDP-CVD process is performed. That is done by introducing silane and oxygen into the chamber to deposit oxide to fill the trenches 8. While filling the trenches 8, there is a thin film of oxide formed on the chamber wall. However, there has been a pre-oxide layer covering the wall of the chamber. As a result, the oxide thin film generated in the trench filling step is able to adhere to the pre-oxide layer. However, the quality of the pre-oxide layer will influence the adherence of the later-formed oxide thin layer. Therefore, forming a pre-oxide layer with good quality is an important factor to prevent the chamber from being contaminated.

In addition, the oxide layer on the chamber wall will become thicker and thicker with every process performed. Therefore, when the oxide layer is too thick, a cleaning process is performed to remove the over-thickened oxide layer. In general, a cleaning process is performed in every ten HDP-CVD processes. However, the frequency of cleaning process performance is changed with the requirements of the process.

Although the particle issue in conventional semiconductor wafer fabrication can be prevented by the above method, in processes with critical dimension less than 90 nm, larger plasma power is applied to dissociate the molecules of reactant gases, so as to improve the gapfill ability and prevent the openings of the trenches from being clogged. When larger plasma power is applied, stronger collisions between particles cause the oxide layer on the wall to strip off more easily. In such a case, the conventional HDP-CVD method will not be able to prevent the particle issue. As a result, there is need for an improved method to resolve the particle issue in small critical dimension processes.

SUMMARY OF INVENTION

A high density plasma chemical vapor deposition method that prevents particles from forming in a chamber is provided in the claimed invention. In addition, a method for forming on the chamber wall an oxide layer with better quality is also provided in the present invention. The oxide layer with better quality enables oxide layers later formed to adhere, so as to prevent them from stripping off and causing a particle issue.

According to the claimed invention, a chemical vapor deposition method that prevents the particle issue in the chamber is disclosed in the present invention. Firstly, a higher low-frequency radio frequency (LFRF) power and longer process time are used to vacate residual gases in the chamber and perform a pre-heat process. Following that, a pre-oxide layer is formed on the chamber wall, and a high frequency radio frequency (HFRF) is simultaneously provided to the chamber to direct charged particles, and to promote the deposition of an oxide layer. The higher LFRF power is continuously provided to the chamber to sustain the temperature of the chamber. Lastly a main oxide layer deposition process is performed. In addition, after several cycles of the main oxide layer deposition processes, a cleaning process is performed to remove an over-thickened oxide layer deposited on the chamber wall.

A pre-oxide layer with better quality is formed according to the present invention. Therefore oxide formed later is able to adhere to the pre-oxide layer and not strip off leading to particle contamination. In other words, the particle issue in the conventional CVD process is solved by the present method.

These and other objectives of the present invention will no doubt become obvious to those of ordinary skill in the art after reading the following detailed description of the preferred embodiment that is illustrated in the various figures and drawings.

DETAILED DESCRIPTION

An improved CVD method is provided in the present invention. The CVD method can enhance the quality of the pre-oxide layer. Therefore the pre-oxide layer is able to endure high-power processes and the strong collisions between particles in a small critical dimension process, and thus not released from the chamber wall. As a result, the particle issue, wherein free particles cause contamination, is solved by the present invention.

Figure 1:
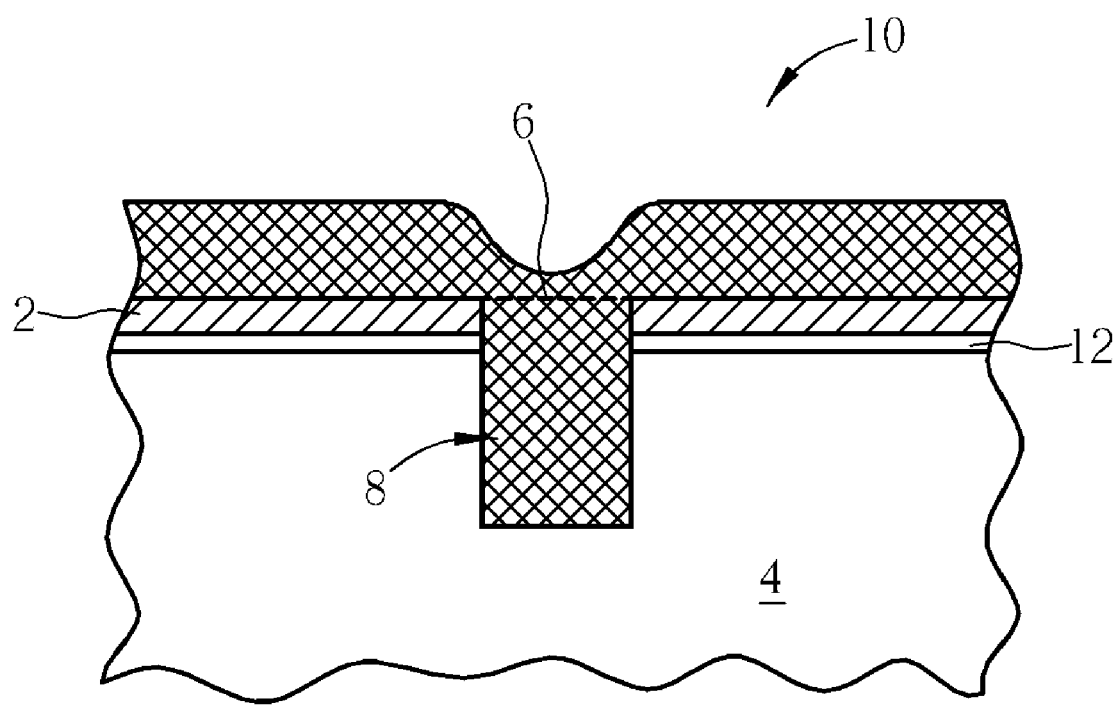
FIG. 1 is a sectional view of a conventional STI structure.
Figure 2:
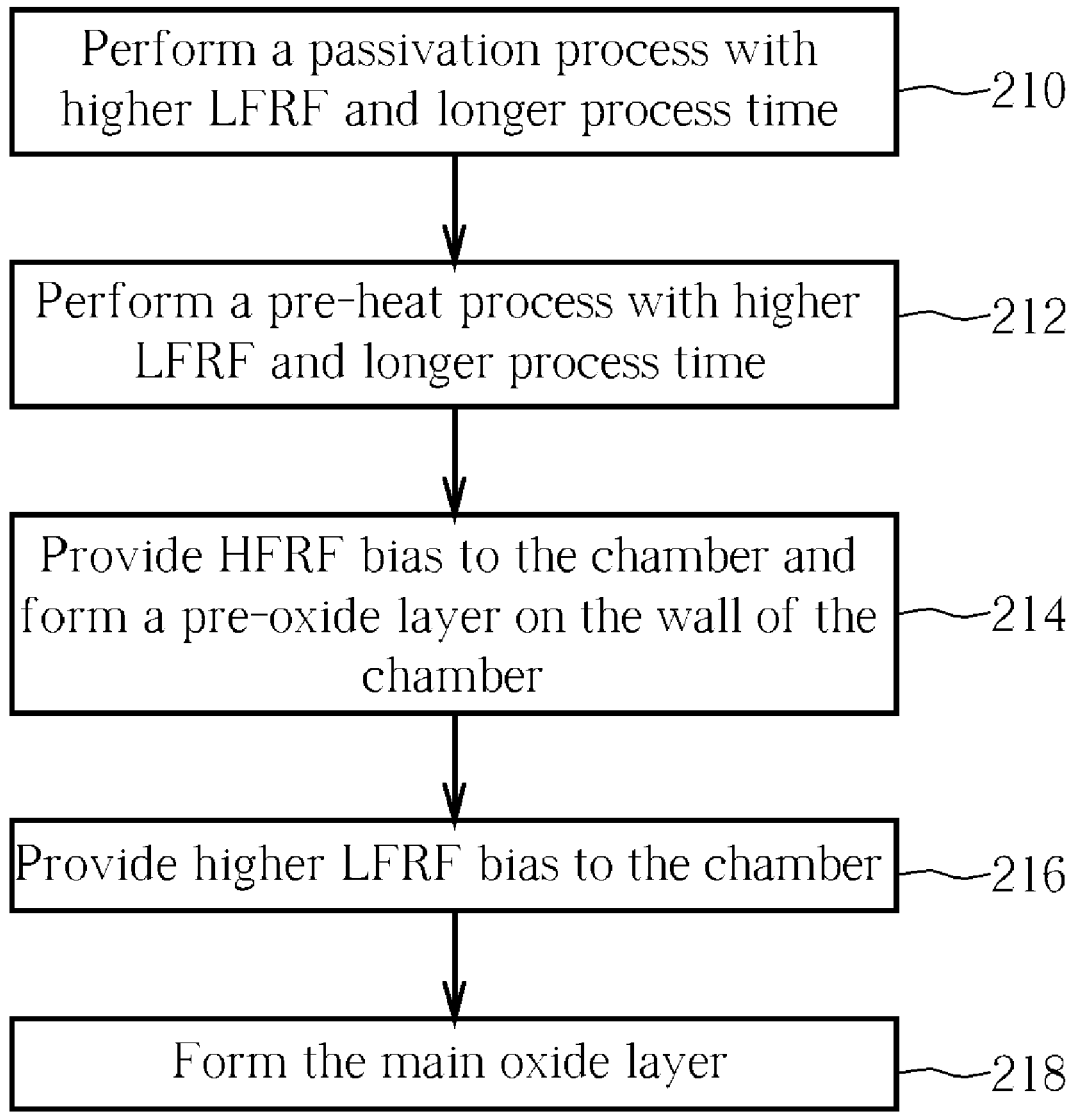
FIG. 2 is a flowchart illustrating an embodiment according to the present invention.

Please refer to FIG. 2. FIG. 2 is a flowchart of a preferred embodiment of the an HDP-CVD method according to the present invention. As shown in FIG. 2, the method according to the present invention includes a passivation process for vacating the chamber (step 210), a pre-heat process (step 212), a pre-oxide layer deposition process (step 214), providing low-frequency radio frequency (LFRF) power (step 216), and a main oxide layer deposition process (step 218). A major difference between the method of the present invention and that in the prior art is that, according to the present invention, all the processes before the main layer deposition process (step 218) are performed under higher power and have higher process temperatures. Therefore, a pre-oxide layer with appropriate thickness and better quality is sustained in a high-power and high-temperature environment as the main oxide layer deposition process (step 218) is performed, and thus is able to endure the environment of the main oxide layer deposition process (step 218). In addition, according to the present invention, a bias is provided in the chamber to direct particles in the chamber, and thus prevent the particles from contaminating the chamber.

Please refer to FIG. 2. An embodiment of the present invention is described as follows. A passivation process is performed in the HDP-CVD chamber (step 210). In the passivation process, hydrogen ($H_2$) is introduced into the chamber to remove residual gases in the chamber, so as to vacate the chamber. For example, a cleaning gas for removing surplus oxides, such as nitrogen fluoride ($NF_3$), may be remained in the chamber after a cleaning process. However, the passivation process according to the present invention is different from those in the prior art. The passivation process according to the present invention is performed under a LFRF power not less than that in the main layer deposition process (step 218). In addition, the process time of the passivation process according to the present invention is longer, so as to raise the temperature of the chamber to a temperature not lower than that in the main layer deposition process (step 218). For example, in a 90 nm process, the LFRF power applied in the main layer deposition process (step 218) is about 5000 watts (W), and therefore an LFRF power of 6000 W is provided to the chamber in the passivation process according to the present invention. The passivation process is continued until the temperature of the chamber is equal to or higher than that in the main layer deposition process (step 218). For example, the passivation process is performed for 240 seconds, and the temperature of the chamber is about 580 degrees centigrade (C).

Following that, a pre-heat process (step 212) is performed in the chamber. The pre-heat process is to raise the temperature of the chamber. In such a process, insert gases, such as argon (Ar), helium (He), or hydrogen ($H_2$) are introduced into the chamber. A semiconductor wafer is also heated to facilitate the performance of subsequent processes. According to the method of the present invention, in the pre-heat process, an LFRF power greater than or equal to what the main layer deposition process (step 218) needs is provided to the chamber, and longer process time is taken to heat the chamber to a temperature higher than that of the main layer deposition process (step 218). For example, an LFRF power of 6000 W is provided to the chamber, and keeps heating the chamber for 180 seconds to raise the temperature of the chamber to 580 C or higher.

After the pre-heat process (step 212) is completed, a pre-oxide layer deposition process (step 214) is subsequently performed to form a pre-oxide layer on the chamber wall. As said above, part of the oxide will deposit on the chamber wall while performing the main oxide layer deposition process (step 218). The oxide on the chamber wall may strip off and form particles that can contaminate the chamber and the wafer. Therefore, an oxide layer with appropriate thickness and quality (i.e. the pre-oxide layer) is provided according to the prior art for oxide later formed to adhere to, and thus prevent the particles from being formed. However, the present invention provides a better way, which is different from that in the prior art, to form the pre-oxide layer. According to the present invention, a HFRF bias is provided to the chamber simultaneously while the pre-oxide layer is being deposited. The HFRF bias is able to direct charged particles and thus prevents the charged particles from contaminating a wafer supporter or other elements in the chamber by making them tend to deposit on the chamber wall.

For example, while a high-power LFRF (e.g. 6000 W) is maintained in the chamber, an HFRF bias of 2000 W is provided to the chamber for 60 seconds. Silane and oxygen are then introduced to the chamber and the LFRF power and the HFRF bias are continuously maintained for another 170 seconds. Under the help of the bias, a pre-oxide layer with better quality and thickness is formed. In addition, owing to the environment in which the pre-oxide layer is formed, which is similar or harsher than that of the main oxide layer process (step 218), the pre-oxide layer is able to endure the high power and high temperature in the subsequent processes and not strip off. It should be noted that, the HFRF bias is provided by electrodes for providing bias to create plasma for bombarding a wafer in the CVD chamber. The bias directs plasma ions with positive charges down to a wafer, but directs the oxide with negative charges up to the chamber wall. Therefore no extra elements are needed to provide the bias. This means that the present invention can be performed easily.

After the pre-oxide layer deposition process (step 214) is completed, a high LFRF power is provided to maintain the temperature of the chamber (step 216). A main oxide layer deposition process (step 218) is subsequently performed. For example, an LFRF power of 6000 W is provided to the chamber for 60 seconds to prepare the environment, and then the main oxide layer deposition process is performed to complete the HDP-CVD process. It is noted that, the method according to the present invention can be applied in HDP-CVD processes in various STI processes, such as inter-level dielectric and inter-metal dielectric.

In addition, performing the main oxide layer deposition process (step 218) leads to oxides piling up on the chamber wall. Therefore, after several cycles of the main oxide layer deposition process (step 218), the oxide layer on the chamber wall will be too thick. In order to remove the over-thickened oxide layer on the chamber wall, a cleaning process is performed according to the present invention. In such a cleaning process, a cleaning gas, such as a fluoride, is introduced into the chamber. For example, after ten cycles of the main oxide layer deposition process (step 218), nitrogen fluoride is introduced into the chamber to remove the thick oxide layer. The residual nitrogen fluoride is removed by the passivation process (step 210). In other words, the passivation process (step 210) may not be performed before every main oxide layer deposition process (step 218), but be performed only when there are surplus cleaning gases present.

Compared to the conventional HDP-CVD method, the present invention decreases the particle issue in the chamber efficiently. For example, compared to a conventional method using 4000 W LFRF power, the above embodiment according to the present invention significantly reduces the amount of particles remaining in the chamber. Thus the maintenance cycle of the chamber is prolonged when adopting the method of the present invention. For example, using parameters in the above embodiment, the chamber is able to perform HDP-CVD for three thousand wafers without maintenance. In other words, adopting the method of the present invention does not only reduce the amount of particles formed in the chamber, but also improves the yield, reduces the maintenance cost of the chamber, and thus increases the throughput.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chemical vapor deposition method for preventing particles from forming in a chamber, comprising:
   providing a first low-frequency radio frequency power to the chamber and introducing an insert gas into the chamber;
   providing a second low-frequency radio frequency power to the chamber and performing a pre-heat process, to raise the temperature of the chamber to a pre-heat temperature;
   forming a pre-oxide layer on a chamber wall; and
   performing a main oxide layer deposition by a third low-frequency radio frequency power at a process temperature which is lower than the pre-heat temperature.

2. The method of claim 1, wherein the chemical vapor deposition method is a high-density plasma vapor deposition method.

3. The method of claim 1, wherein the chemical vapor deposition method is used to fill a recess on a semiconductor substrate to perform a shallow trench isolation process.

4. The method of claim 1, wherein the insert gas is hydrogen, and is used to vacate residual gases in the chamber.

5. The method of claim 1, wherein the range of the first low-frequency radio frequency power is 5000 to 15000 watts.

6. The method of claim 1, wherein the range of the second low-frequency radio frequency power is 5000 to 15000 watts.

7. The method of claim 1, wherein the pre-heat temperature is achieved by prolonging a time of providing the first low-frequency radio frequency power or the second low-frequency radio frequency power.

8. The method of claim 1, wherein after providing the third low-frequency radio frequency power to the chamber and raising the temperature of the chamber to the process temperature, further providing a fourth low-frequency radio frequency power to the chamber, and performing the main oxide layer deposition step.

9. The method of claim 8, wherein the range of the third low-frequency radio frequency power is 5000 to 15000 watts.

10. The method of claim 8, wherein the fourth low-frequency radio frequency power is smaller than the first, the second, or the third low-frequency radio frequency power.

11. The method of claim 1, wherein the pre-oxide layer is a silicon oxide layer to be adhered to by oxides later formed and thus preventing the oxides from stripping off and forming particles.

12. The method of claim 1, further comprising performing a cleaning process to remove oxide on the chamber wall when the oxide layer is over-thickened.

13. The method of claim 1, wherein the step of forming the pre-oxide layer on the chamber wall further comprises providing a bias to the chamber.

14. The method of claim 13, wherein the bias is provided by a high-frequency radio frequency power, and the range of the high-frequency radio frequency power is 1000 to 10000 watts.

* * * * *